(12) United States Patent
Degura et al.

(10) Patent No.: US 10,413,986 B2
(45) Date of Patent: Sep. 17, 2019

(54) ESTIMATION DEVICE

(71) Applicant: FUJI CORPORATION, Chiryu-shi (JP)

(72) Inventors: Kazuya Degura, Toyota (JP); Satoru Otsubo, Anjo (JP)

(73) Assignee: FUJI CORPORATION, Chiryu-shi (JP)

( * ) Notice: Subject to any disclaimer, the term of this patent is extended or adjusted under 35 U.S.C. 154(b) by 0 days.

(21) Appl. No.: 15/738,772

(22) PCT Filed: Jun. 23, 2015

(86) PCT No.: PCT/JP2015/068001
§ 371 (c)(1),
(2) Date: Dec. 21, 2017

(87) PCT Pub. No.: WO2016/207971
PCT Pub. Date: Dec. 29, 2016

(65) Prior Publication Data
US 2018/0185946 A1 Jul. 5, 2018

(51) Int. Cl.
*B23K 3/00* (2006.01)
*B23K 3/06* (2006.01)
*H05K 3/34* (2006.01)

(52) U.S. Cl.
CPC .......... *B23K 3/0653* (2013.01); *B23K 3/0646* (2013.01); *H05K 3/34* (2013.01);
(Continued)

(58) Field of Classification Search
CPC .................. B23K 3/0653; G01F 23/2921
See application file for complete search history.

(56) References Cited

U.S. PATENT DOCUMENTS 6,452,202 B1 * 9/2002 Eom ................... G01F 23/2921
250/574

FOREIGN PATENT DOCUMENTS

| JP | 61-22261 U | 2/1986 |
| JP | 62-199266 A | 9/1987 |

(Continued)

OTHER PUBLICATIONS

International Search Report dated Aug. 25, 2015, in PCT/JP2015/068001 filed Jun. 23, 2015.

(Continued)

*Primary Examiner* — Erin B Saad
(74) *Attorney, Agent, or Firm* — Oblon, McClelland, Maier & Neustadt, L.L.P.

(57) ABSTRACT

A soldering device includes a detection sensor which can detect a liquid level height of molten solder inside a solder bath. It is determined whether or not a detection height which is the detected liquid level height is greater than or equal to a first set height which is arbitrarily set. In a case where the detection height is greater than or equal to the first set height, it is estimated that the amount of molten solder capable of performing a soldering work for a predetermined number or more of boards is stored in the solder bath. The amount of molten solder stored in the solder bath is estimated by multiplying a difference between a detection height which is the detected liquid level height of the molten solder and a second set height which is preset, by an area inside the solder bath in a horizontal direction.

5 Claims, 14 Drawing Sheets

(52) U.S. Cl.
CPC ... *H05K 3/3447* (2013.01); *H05K 2203/0126* (2013.01); *H05K 2203/0475* (2013.01); *H05K 2203/163* (2013.01)

(56) References Cited

FOREIGN PATENT DOCUMENTS

| | | |
|---|---|---|
| JP | 5-327204 A | 12/1993 |
| JP | 8-10942 A | 1/1996 |
| JP | 11-254129 A | 9/1999 |
| JP | 2000-19001 A | 1/2000 |
| JP | 2002-118356 A | 4/2002 |
| JP | 2008-238237 A | 10/2008 |

OTHER PUBLICATIONS

Extended European Search Report dated Jun. 4, 2018 in European Patent Application No. 15896293.6, 5 pages.

* cited by examiner

ESTIMATION DEVICE

TECHNICAL FIELD

The present disclosure relates to an estimation device that estimates the amount of molten solder in a solder bath of a soldering device.

BACKGROUND ART

In a soldering device that performs a soldering work using a molten solder stored in a solder bath, the amount of the molten solder stored in the solder bath is estimated and the soldering work is performed according to the amount of estimated storage, as described in PTL 1 and PTL 2.

CITATION LIST

Patent Literature

PTL 1: JP-A-2002-118356
PTL 2: JP-A-11-254129

BRIEF SUMMARY

Problem to be Solved

According to a technology described in PTL 1 and PTL 2, it is possible to estimate the amount of molten solder stored in a solder bath. However, it is possible to perform various soldering works by estimating the amount of storage of molten solder by using not only a method of estimating the amount of storage of molten solder described in PTL 1 and PTL 2 but also various methods. The present disclosure is made in view of such circumstances, and an object of the present disclosure is to estimate the amount of storage of molten solder by using various methods.

Means for Solving the Problem

In order to solve the above-described problem, an estimation device according to the present disclosure is an estimation device estimating the amount of molten solder inside a solder bath of a soldering device soldering leads of a lead component which is mounted on a board by jetting molten solder stored in the solder bath, in which the soldering device includes a detection sensor capable of detecting a liquid level height of the molten solder inside the solder bath, and in which the estimation device includes at least one of a first estimation section determining whether or not a detection height that is the liquid level height of molten solder which is detected by the detection sensor is greater than or equal to a first set height which is arbitrarily set, and, in a case where the detection height is greater than or equal to the first set height, estimating that molten solder of an amount capable of performing a soldering work for a predetermined number or more of boards by using the soldering device is stored in the solder bath; and a second estimation section estimating the amount of molten solder that is stored in the solder bath by multiplying a difference between the detection height and a preset second set height by an area of the solder bath in a horizontal direction.

Advantageous Effects

An estimation device according to the present disclosure includes a detection sensor that can detect a liquid level height of molten solder in a solder bath. Then, it is determined whether or not a detection height, which is the liquid level height of the molten solder detected by the detection sensor, is greater than or equal to a first set height that is arbitrarily set. In this case, in a case where the detection height is greater than or equal to the first set height, it is estimated that the amount of molten solder that can be used to perform a soldering work with respect to a predetermined number or more of boards is stored in the solder bath. In addition, the amount of molten solder stored in the solder bath is estimated by multiplying a difference between the detection height which is the liquid level height of the molten solder detected by the detection sensor and a preset second set height, by an area of the solder bath in a horizontal direction. As described above, the estimation device of the present disclosure can estimate the amount of storage of molten solder by using various methods.

DETAILED DESCRIPTION

Hereinafter, embodiments of the present disclosure will be described in detail with reference to the drawings as forms for performing the present disclosure.

<Configuration of Component Mounting Machine>

Figure 1:
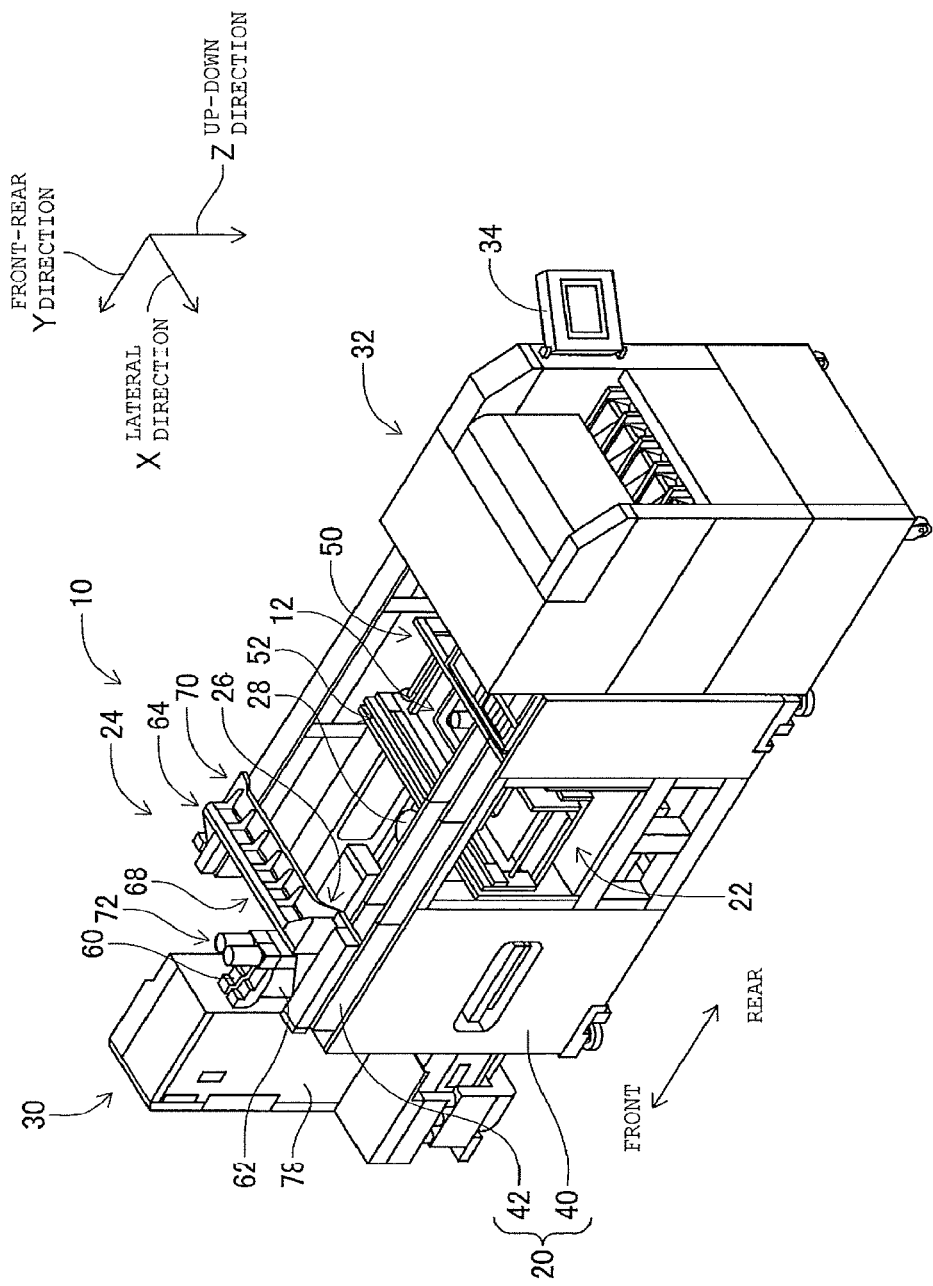
FIG. 1 is a perspective view illustrating a component mounting machine.

FIG. 1 illustrates a component mounting machine 10. The component mounting machine 10 is a device for performing a component mounting work for a circuit substrate 12. The component mounting machine 10 includes a device main body 20, a substrate conveyance and holding device 22, a component mounting device 24, a mark camera 26, a parts camera 28, a component supply device 30, a bulk component supply device 32, a display device 34, a soldering device (see FIG. 3) 36, and a control device (see FIG. 5) 38. A circuit board, a substrate having a three-dimensional structure, or the like can be used as the circuit substrate 12, and a printed wiring board, a printed circuit board, or the like can be used as the circuit board.

The device main body 20 is configured by a frame section 40 and a beam section 42 overlying the frame section 40. The substrate conveyance and holding device 22 is disposed at the center of the frame section 40 in a front-rear direction, and includes a conveyance device 50 and a clamping device 52. The conveyance device 50 is a device that conveys the circuit substrate 12, and the clamping device 52 is a device that holds the circuit substrate 12. Thereby, the substrate conveyance and holding device 22 conveys the circuit substrate 12 and holds the circuit substrate 12 in a fixed manner at a predetermined position. In the following description, a conveyance direction of the circuit substrate 12 is referred to as an X-direction, a horizontal direction perpendicular to the direction is referred to as a Y-direction, and a vertical direction is referred to as a Z-direction. That is, a width direction of the component mounting machine 10 is the X-direction, and the front-rear direction is the Y-direction.

Figure 2:
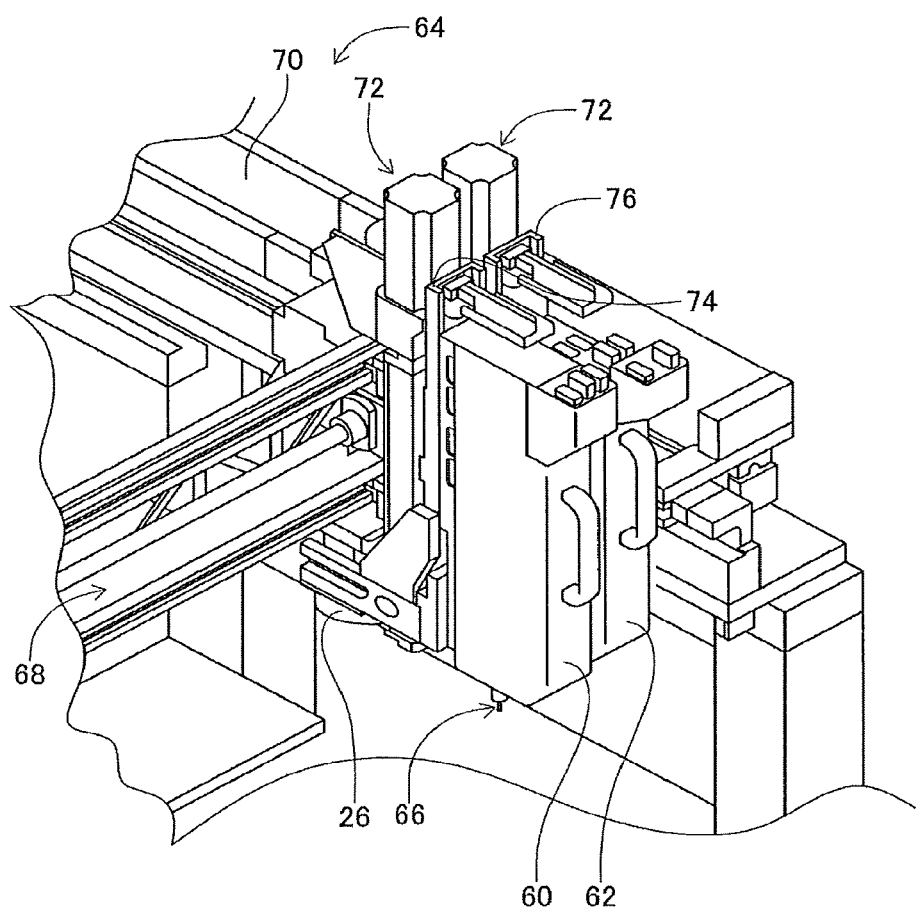
FIG. 2 is a perspective view illustrating the component mounting device.

The component mounting device 24 is disposed in the beam section 42 and has two work heads 60 and 62 and a work head moving device 64. As illustrated in FIG. 2, a suction nozzle 66 is provided on the lower end face of each of the work heads 60 and 62, and the suction nozzle 66 sucks and holds components. In addition, the work head moving device 64 includes an X-direction moving device 68, a Y-direction moving device 70, and a Z-direction moving device 72. Then, the two work heads 60 and 62 are integrally moved to an arbitrary position on the frame section 40 by the X-direction moving device 68 and the Y-direction moving device 70. In addition, the work heads 60 and 62 are detachably mounted on sliders 74 and 76, and the Z-direction moving device 72 individually moves the sliders 74 and 76 in the up-down direction. That is, the work heads 60 and 62 are individually moved in the up-down direction by the Z-direction moving device 72.

The mark camera 26 is attached to the slider 74 in a state of facing downward, and is moved together with the work head 60 in the X-direction, the Y-direction, and the Z-direction. Thereby, the mark camera 26 captures an image of an arbitrary position on the frame section 40. As illustrated in FIG. 1, the parts camera 28 is disposed between the substrate conveyance and holding device 22 on the frame section 40 and the component supply device 30 in a state of facing upward. Thereby, the parts camera 28 captures an image of components gripped by the suction nozzles 66 of the work heads 60 and 62.

The component supply device 30 is disposed at an end portion of one side of the frame section 40 in the front-rear direction. The component supply device 30 includes a tray-type component supply device 78 and a feeder-type component supply device (see FIG. 5) 80. The tray-type component supply device 78 is a device that supplies components in a state of being placed on a tray. The feeder-type component supply device 80 is a device that supplies components by using a tape feeder and a stick feeder (not illustrated).

A bulk component supply device 32 is disposed at an end portion of the other side of the frame section 40 in the front-rear direction. The bulk component supply device 32 is a device that aligns multiple components in a state of being scattered at random and supplies the components in an aligned state. That is, the bulk component supply device is a device that aligns the multiple components which is in an arbitrary posture in a predetermined posture and supplies the components in the predetermined posture. In addition, the display device 34 is disposed at an end portion of the bulk component supply device 32. The display device 34 displays information on a mounting work of the components performed by the component mounting machine 10.

Components supplied by the component supply device 30 and the bulk component supply device 32 include electronic circuit components, configuration components of a power module, and the like. In addition, the electronic circuit components include components having leads, components having no leads, and the like.

Figure 3:
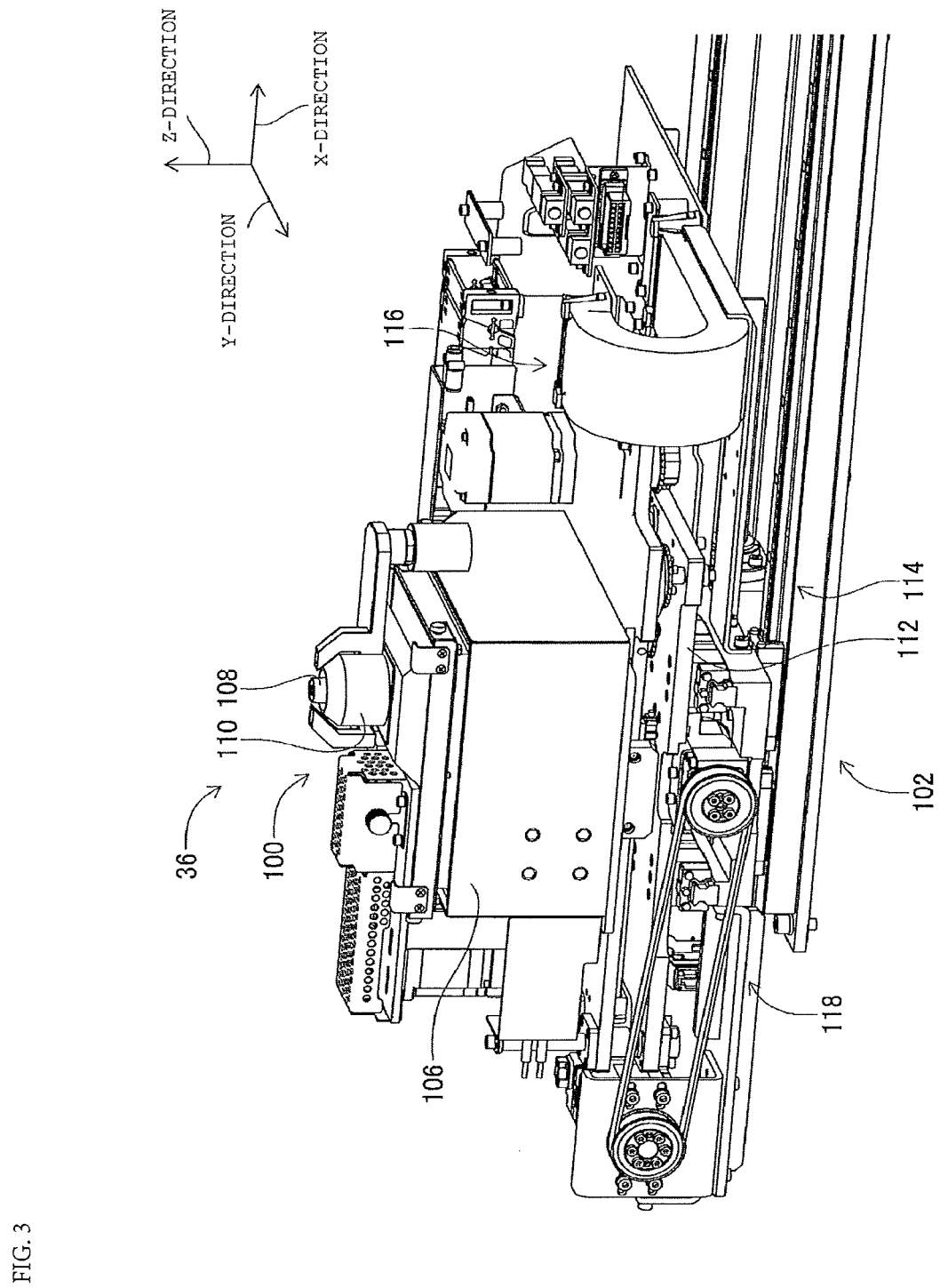
FIG. 3 is a perspective view illustrating a soldering device.

The soldering device 36 is disposed on a lower portion of the conveyance device 50, and includes a jet device 100, a jet device moving device 102, and a solder replenishment device (see FIG. 4) 104, as illustrated in FIG. 3. The jet device 100 includes a solder bath 106, a jet nozzle 108, and a nozzle cover 110. The solder bath 106 has an approximately rectangular parallelepiped shape, and molten solder is stored therein. The jet nozzle 108 is erected on an upper face of the solder bath 106. Then, by an operation of a pump (not illustrated), molten solder is pumped up from the solder bath 106, and the molten solder is jetted upward from an upper end portion of the jet nozzle 108. In addition, the nozzle cover 110 is approximately cylindrical in shape and is disposed on an upper face of the solder bath 106 so as to surround the jet nozzle 108. Then, the molten solder jetted from the upper end portion of the jet nozzle 108 passes between an outer peripheral surface of the jet nozzle 108 and an inner peripheral surface of the nozzle cover 110 and returns to the inside of the solder bath 106.

The jet device moving device 102 includes a slider 112, an X-direction moving device 114, a Y-direction moving device 116, and a Z-direction moving device 118. The slider 112 has approximately a plate shape, and the jet device 100 is disposed on an upper face of the slider 112. In addition, the X-direction moving device 114 moves the slider 112 in a conveyance direction of the circuit substrate 12 by using the conveyance device 50, that is, the X-direction, and the Y-direction moving device 116 moves the slider 112 in the Y-direction. Furthermore, the Z-direction moving device 118 moves the slider 112 in the Z-direction, that is, in the up-down direction. Thereby, the jet device 100 moves to an arbitrary position under the conveyance device 50 in accordance with an operation of the jet device moving device 102. The jet device moving device 102 moves the jet device 100 between a work area for performing a soldering work and a replenishment area for supplying solder to the solder bath 106.

Figure 4:
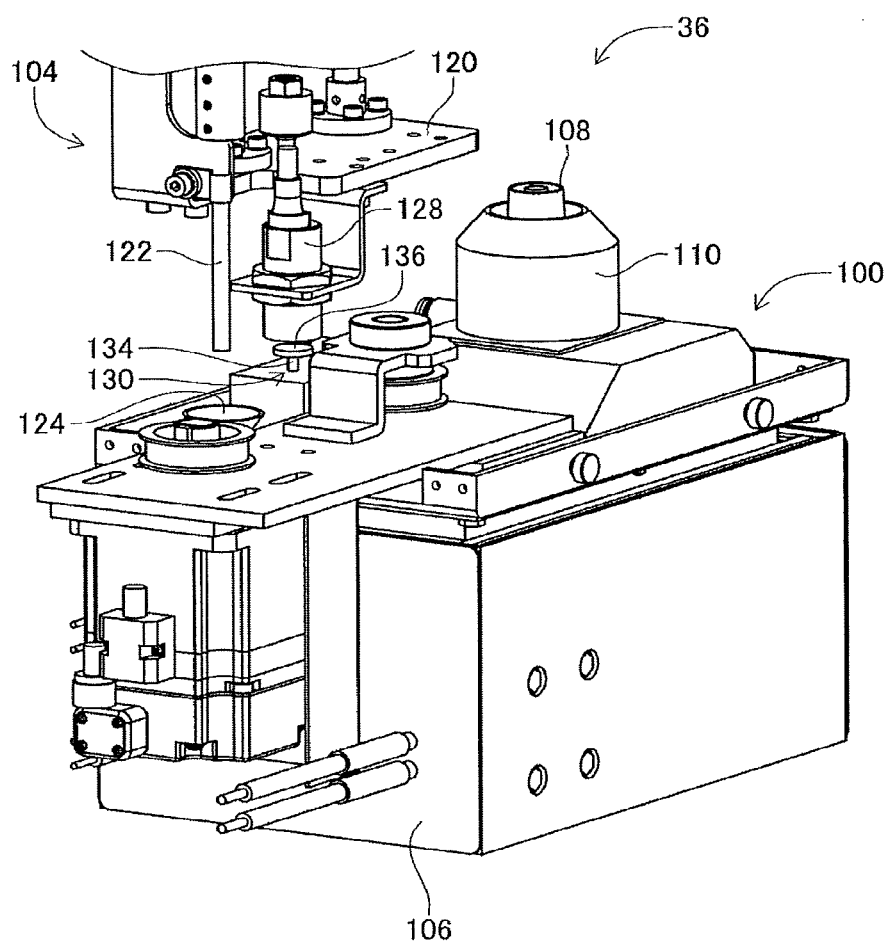
FIG. 4 is a perspective view illustrating a jet device.

In addition, in a case where the jet device 100 is moved to the replenishment area by the jet device moving device 102, a bracket 120 is disposed above the jet device 100, and a solder replenishment device 104 is disposed in the bracket 120, as illustrated in FIG. 4. The solder replenishment device 104 includes a solder reel holding section (not illustrated) and a solder introduction pipe 122. The solder reel is formed by winding a linear solder and is held by a solder reel holding section. The solder introduction pipe 122 is disposed above the solder bath 106 of the jet device 100 so as to extend in the up-down direction, and an end portion of the solder held by the solder reel holding section is inserted from an upper end of the solder introduction pipe 122. Then, the solder extends downward from a lower end of the solder introduction pipe 122. In addition, a replenishment hole 124 is formed in an upper face of the solder bath 106 below the solder introduction pipe 122, and the solder extending from the lower end of the solder introduction pipe 122 is inserted into the replenishment hole 124. Then, the solder held by the solder reel holding section is sent out by an operation of an electromagnetic motor (not illustrated). Thereby, the solder is inserted from the solder introduction pipe 122 into the solder bath 106 through the replenishment hole 124. At this time, the solder melts inside the solder bath 106, and thereby, molten solder is replenished to the solder bath 106.

In addition, a detection sensor 128 is disposed in the bracket 120. The detection sensor 128 is an ON-OFF sensor, and can detect a distance to a float 130 provided in the solder bath 106. In detail, the float 130 includes a float section (see FIG. 7) 132, a shaft section 134, and a measurement section 136. The float section 132 is approximately disc-shaped and floats on the molten solder in the solder bath 106. The shaft section 134 is erected on the float section 132, and an upper end of the shaft section 134 extends to an upper face side of the solder bath through a through hole (not illustrated) formed in an upper face of the solder bath 106. The measurement section 136 which is approximately disk-shaped is fixed on an upper end of the shaft section 134 so as to be perpendicular to the shaft section 134. Then, the detection sensor 128 is disposed above the measurement section 136 in a state of facing downward. In a case where a distance between the detection sensor 128 and the measurement section 136 is less than or equal to a set distance L, the detection sensor 128 is a sensor that outputs an ON value and outputs the ON value based on a liquid level height of the molten solder stored in the solder bath 106. Accordingly, it is possible to detect the liquid level height of the molten solder on the basis of a detection value of the detection sensor 128. A method of detecting the liquid level height of the molten solder by using the detection sensor 128 will be described below.

Figure 5:
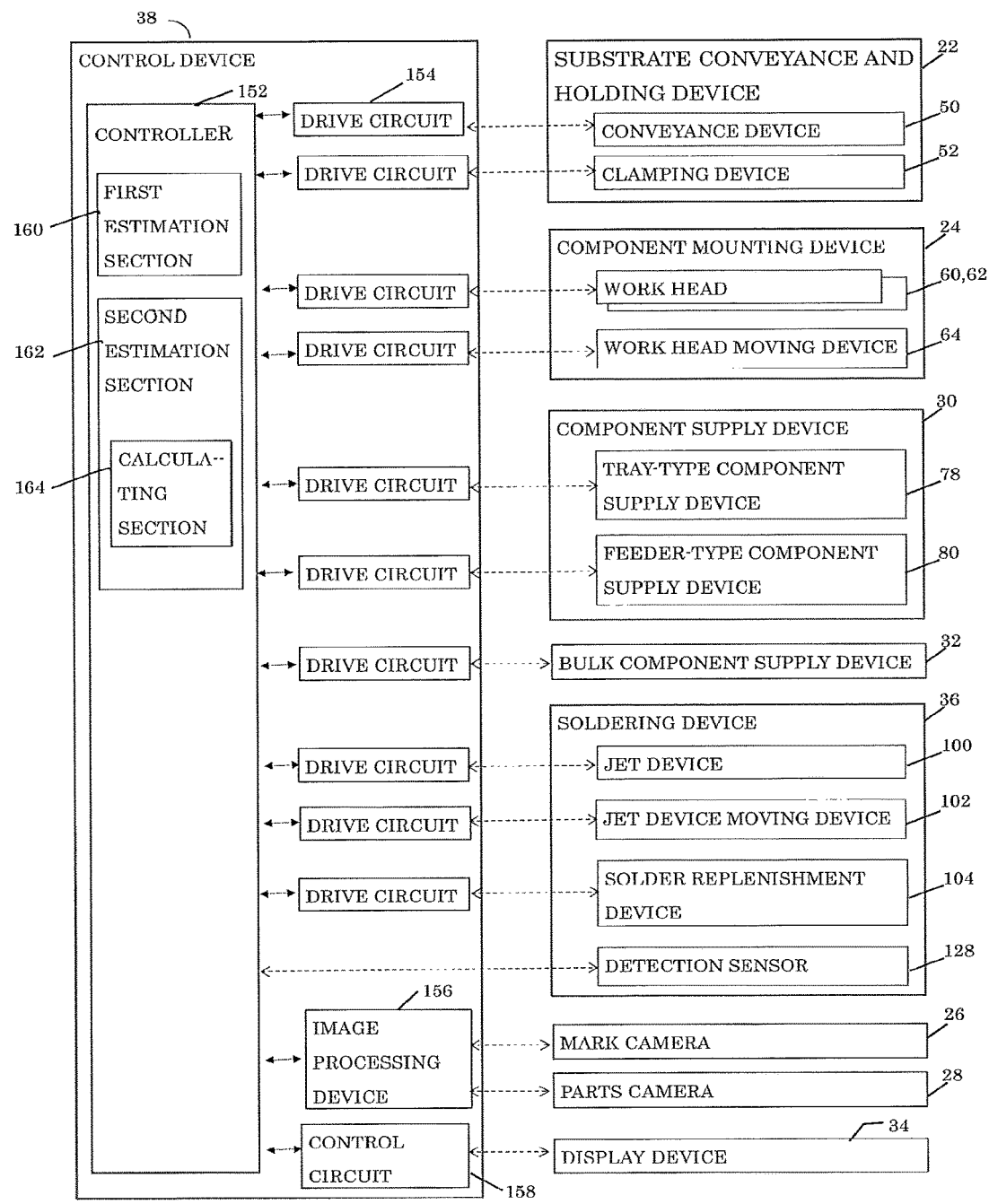
FIG. 5 is a block diagram illustrating a control device.

In addition, as illustrated in FIG. 5, the control device 38 includes a controller 152, multiple drive circuits 154, an image processing device 156, and a control circuit 158. The multiple drive circuits 154 are connected to the conveyance device 50, the clamping device 52, the work heads 60 and 62, the work head moving device 64, the tray-type component supply device 78, the feeder-type component supply device 80, the bulk component supply device 32, the jet device 100, the jet device moving device 102, and the solder replenishment device 104. The controller 152 includes a CPU, a ROM, a RAM, and the like, and mainly controls a computer, and is connected to the multiple drive circuits 154. Thereby, operations of the substrate conveyance and holding device 22, the component mounting device 24, and the like are controlled by the controller 152. In addition, the controller 152 is also connected to the image processing device 156. The image processing device 156 processes image data obtained by the mark camera 26 and the parts camera 28, and the controller 152 acquires various information from the image data. Furthermore, the controller 152 is connected to the display device 34 through the control circuit 158, and a predetermined image is displayed on the display device 34 by the controller 152. In addition, the detection sensor 128 is also connected to the controller 152, and a detection value is input to the controller 152 by the detection sensor 128.

<Operation of Component Mounting Machine>

The component mounting machine 10 according to the above-described configuration performs mounting work of the components with respect to the circuit substrate 12 held by the substrate conveyance and holding device 22. The component mounting machine 10 can mount various components on the circuit substrate 12, but a case where a component having a lead (hereinafter, there is a case of being abbreviated as a "lead component") is mounted on the circuit substrate 12 will be described hereinafter.

Figure 6:
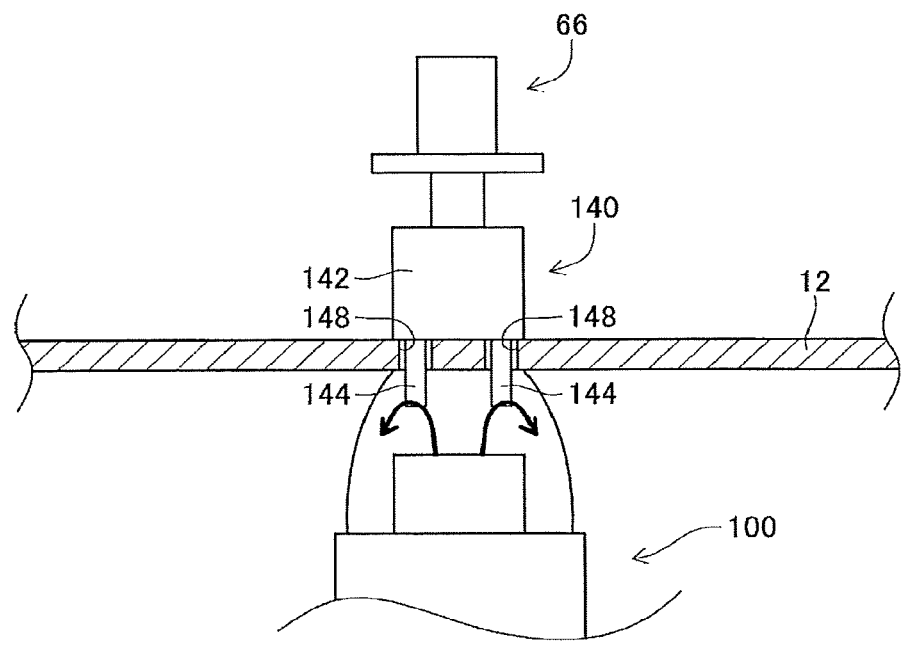
FIG. 6 is a schematic diagram illustrating a state where molten solder is jetted toward a lead inserted in a through hole of a circuit substrate.

Specifically, the circuit substrate 12 is conveyed to a working position and is held by the clamping device 52 in a fixed manner at the position. Next, the mark camera 26 moves above the circuit substrate 12 and captures an image of the circuit substrate 12. Thereby, information on a holding position and the like of the circuit substrate 12 is obtained. In addition, the component supply device 30 or the bulk component supply device 32 supplies the lead component at a predetermined supply position. Then, one of the work heads 60 and 62 moves above a supply position of the component and the component is held by the suction nozzle 66. As illustrated in FIG. 6, the lead component 140 is configured by a component main body section 142 and two leads 144 extending from a bottom face of the component main body section 142. Then, the lead component 140 is sucked and held on a surface on a side opposite to the bottom face of the component main body section 142 by the suction nozzle 66.

Subsequently, the work heads 60 and 62 holding the lead component 140 move above the parts camera 28, and an image of the lead component 140 held by the suction nozzle 66 is captured by the parts camera 28. Thereby, information on the holding position and the like of the component is obtained. Subsequently, the work heads 60 and 62 holding the lead component 140 move above the circuit substrate 12, and correct an error of the holding position of the circuit substrate 12, an error of the holding position of the component, and the like. Then, the leads 144 of the lead component 140 sucked and held by the suction nozzle 66 are inserted into the through holes 148 formed in the circuit substrate 12. At this time, the jet device 100 moves below the through holes 148. Then, the molten solder is jetted by the jet device 100 toward the leads 144 inserted in the through holes 148. Thereby, the lead component 140 is soldered to the circuit substrate 12 in a state where the leads 144 are inserted into the through holes 148.

<Replenishment of Molten Solder>

As described above, the component mounting machine 10 performs the soldering work of the leads 144 by using the jet device 100, and thereby, the lead component 140 is mounted on the circuit substrate 12. Accordingly, molten solder stored in the solder bath 106 is used for the mounting work of the lead component 140, and thus, the molten solder is replenished as necessary. Specifically, the molten solder is supplied to the solder bath 106 such that, each time the mounting work is performed for the circuit substrate 12 of a preset number (hereinafter, there is a case of being referred to as a "set number"), molten solder of a preset maximum amount (hereinafter, there is a case of being referred to as a "set maximum storage amount") is stored.

Figure 7:
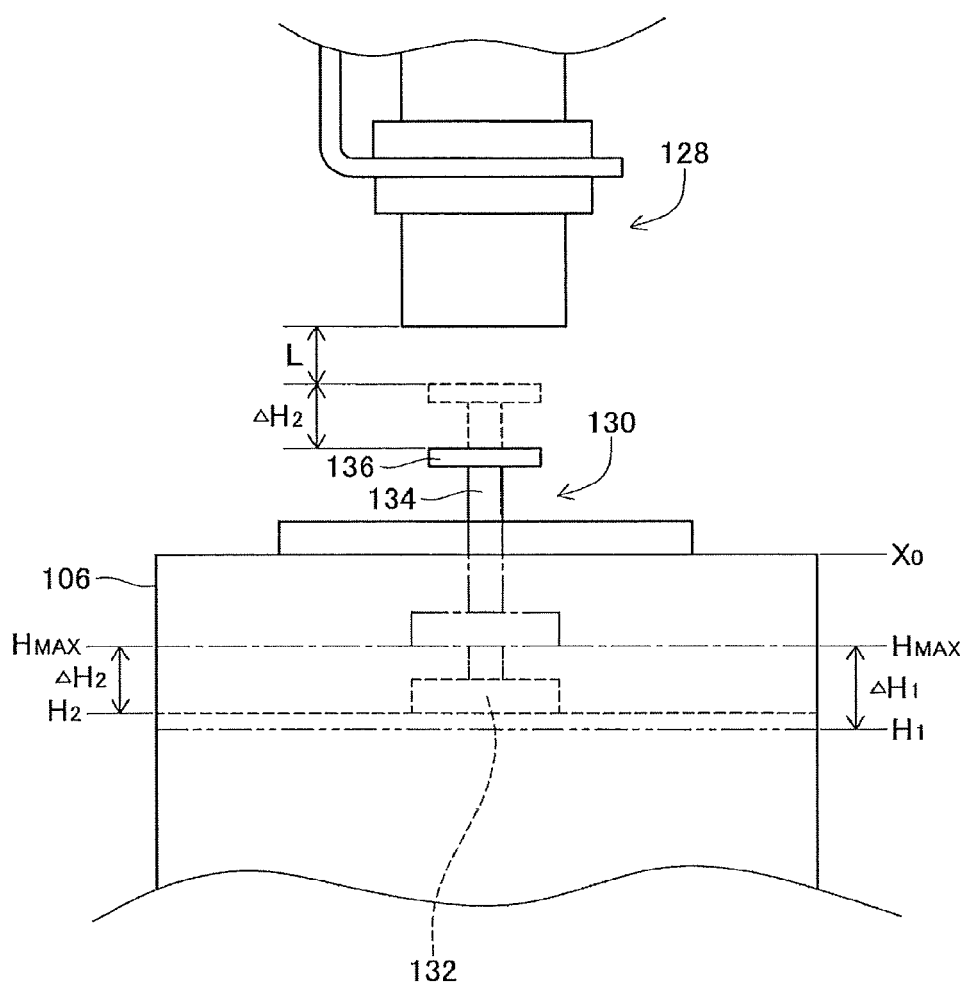
FIG. 7 is a schematic diagram illustrating a solder bath when a first solder remaining amount measurement is performed.

In detail, when the jet device 100 is moved in the up-down direction by the Z-direction moving device 118 of the jet device moving device 102, a reference height of the solder bath 106 is set to $X_0$. As illustrated in FIG. 7, in a case where the molten solder of the set maximum storage amount is stored in the solder bath 106 (in a case where the molten solder is stored until a height $H_{MAX}$ denoted by an alternate long and short dash line in the solder bath 106), the reference height $X_0$ is set to a height of the solder bath 106 in which a distance between the measurement section 136 of the float 130 and the detection sensor 128 becomes a set distance L. Then, when the molten solder is replenished, the jet device 100 is moved to a replenishment area by an operation of the jet device moving device 102, and the solder bath 106 is moved up and down to the reference height $X_0$.

At this time, for example, in a case where a liquid level height of the molten solder in the solder bath 106 is lowered to a height denoted by a dotted line of the figure by use of the molten solder, the distance between the measurement section 136 and the detection sensor 128 is longer than the set distance L, as can be seen from the figure. Accordingly, the measurement section 136 is not detected by the detection sensor 128. Therefore, the solder replenishment device 104 is operated to replenish the molten solder to the solder bath 106. Thereby, the liquid level height of the molten solder in the solder bath 106 increases. Then, the operation of the solder replenishment device 104 is stopped at the timing when the measurement section 136 is detected by the detection sensor 128, that is, when the distance between the detection sensor 128 and the measurement section 136 reaches the set distance L. Thereby, replenishment of the molten solder is completed, and the molten solder of the set maximum storage amount is stored in the solder bath 106. Then, the jet device 100 moves to the work area, and the soldering work is performed. Furthermore, in the work area, after the soldering work is performed for the set number of circuit substrates 12, the jet device 100 moves to the replenishment area and replenishment of the molten solder is performed. As such, the soldering device 36 repeats the soldering work for the set number of circuit substrates 12 and the replenishment work of the molten solder at the normal time, and thereby, the circuit substrates 12 are produced.

<Measurement of Remaining Molten Solder>

However, in a case where the scheduled production number of circuit substrates 12 is smaller than the set number, there is a case where it is preferable to perform a soldering work by using the molten solder remaining in the solder bath 106 rather than performing replenishment of the molten solder. Specifically, for example, there is a case where it is desired to perform the soldering work for five circuit substrates 12 after the set number is 30 and the soldering work for the set number of circuit substrates 12 is completed. In such a case, if the molten solder which can be used for performing the soldering work of the five circuit substrates 12 remains in the solder bath 106, it is preferable that the soldering work is performed by the molten solder remained in the solder bath 106 without replenishing the molten solder.

In view of the circumstances, the soldering device 36 performs determination (hereinafter, there is a case of being referred to as "first solder remaining amount measurement") on whether or not molten solder which can be used for performing a soldering work for an arbitrary number of circuit substrates 12 remains in the solder bath 106. Specifically, in a case where the amount of molten solder which can be used for performing the soldering work for the arbitrary number of circuit substrates 12 remains in the solder bath 106, a liquid level height (height denoted by a two-dot chain line within the solder bath 106) $H_1$ of the molten solder is set to the first set height. The amount of molten solder which can be used for performing the soldering work for the arbitrary number of circuit substrates 12 is set to the amount of molten solder necessary for performing the soldering work for one circuit substrate 12, and is the amount obtained by multiplying by an arbitrary number.

Next, the liquid level height (hereinafter, there is a case of being referred to as a "maximum liquid level height") $H_{MAX}$ of the molten solder when the set maximum storage amount of molten solder is stored in the solder bath 106, and a liquid level difference $\Delta H_1$ (=$H_{MAX}$−$H_1$) with the set height $H_1$ are calculated. Then, the jet device 100 (see FIG. 7) positioned at the reference height $X_0$ is lifted by a distance corresponding to the liquid level difference $\Delta H_1$ by the Z-direction moving device 118 of the jet device moving device 102 (see FIG. 8). At this time, in a case where the measurement section 136 is detected by the detection sensor 128, it is determined that the amount of molten solder which can be used for performing the soldering work for the arbitrary number of circuit substrates 12 remains in the solder bath 106. Meanwhile, in a case where the measurement section 136 is not detected by the detection sensor 128, it is determined that the amount of molten solder which can be used for performing the soldering work for the arbitrary number of circuit substrates 12 does not remain in the solder bath 106.

Figure 8:
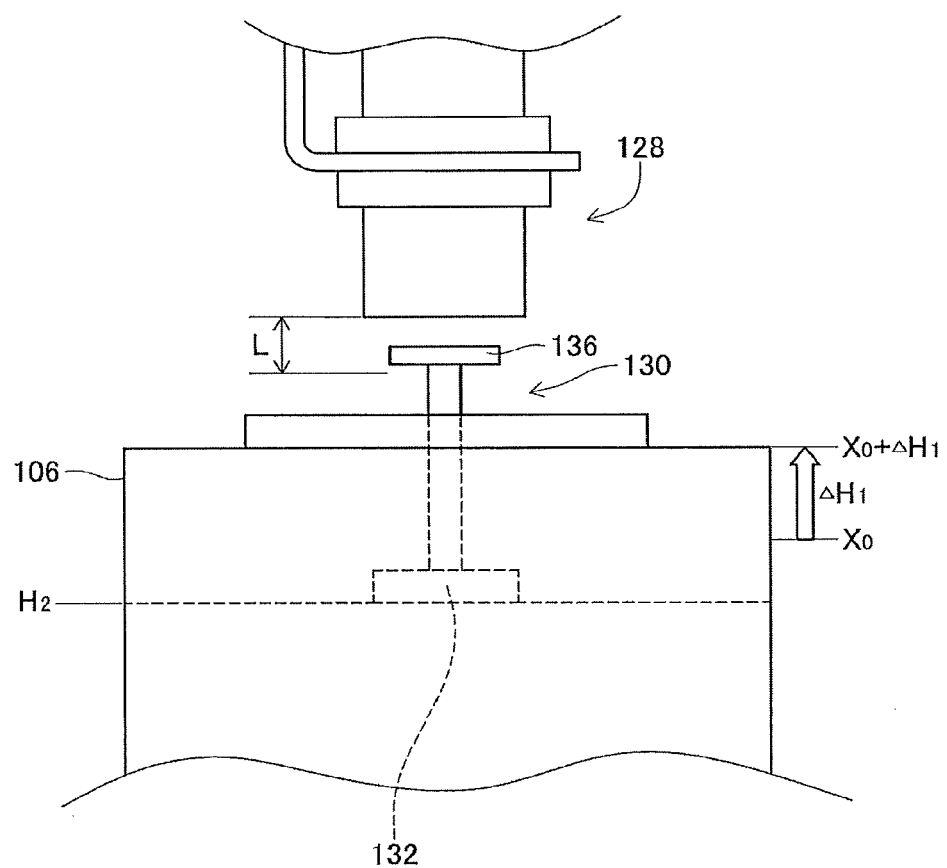
FIG. 8 is a schematic diagram illustrating the solder bath when the first solder remaining amount measurement is performed.

Specifically, for example, a case where an actual liquid level height (hereinafter, there is a case of being referred to as an "actual liquid level height") $H_2$ denoted by a dotted line in FIG. 7 is higher than the set height $H_1$ will be described. In a case where the molten solder is stored up to the actual liquid level height $H_2$, a difference between the measurement section 136 of the float 130 and the detection sensor 128 corresponds to a value ($\Delta H_2$+L) obtained by adding the set distance L to the liquid level difference $\Delta H_2$ (=$H_{MAX}$−$H_2$) between the maximum liquid level height $H_{MAX}$ and the actual liquid level height $H_2$. In addition, the actual liquid level height $H_2$ is higher than the set height $H_1$, and thereby, the liquid level difference $\Delta H_2$ is smaller than the liquid level difference $\Delta H_1$. Accordingly, in a case where the jet device 100 positioned at the reference height $X_0$ is lifted by a distance corresponding to the liquid level difference $\Delta H_1$, a difference between the measurement section 136 of the float 130 and the detection sensor 128 becomes a value obtained by subtracting the liquid level difference $\Delta H_1$ (>$\Delta H_2$) from the value ($\Delta H_2$+L) obtained by adding the set distance L to the liquid level difference $\Delta H_2$, and is shorter than the set distance L, as illustrated in FIG. 8. Accordingly, the measurement section 136 is detected by the detection sensor 128. That is, an ON value is input to the controller 152 by the detection sensor 128, and the controller 152 determines that molten solder which can be used for performing the soldering work for the arbitrary number of circuit substrates 12 remains in the solder bath 106.

Figure 9:
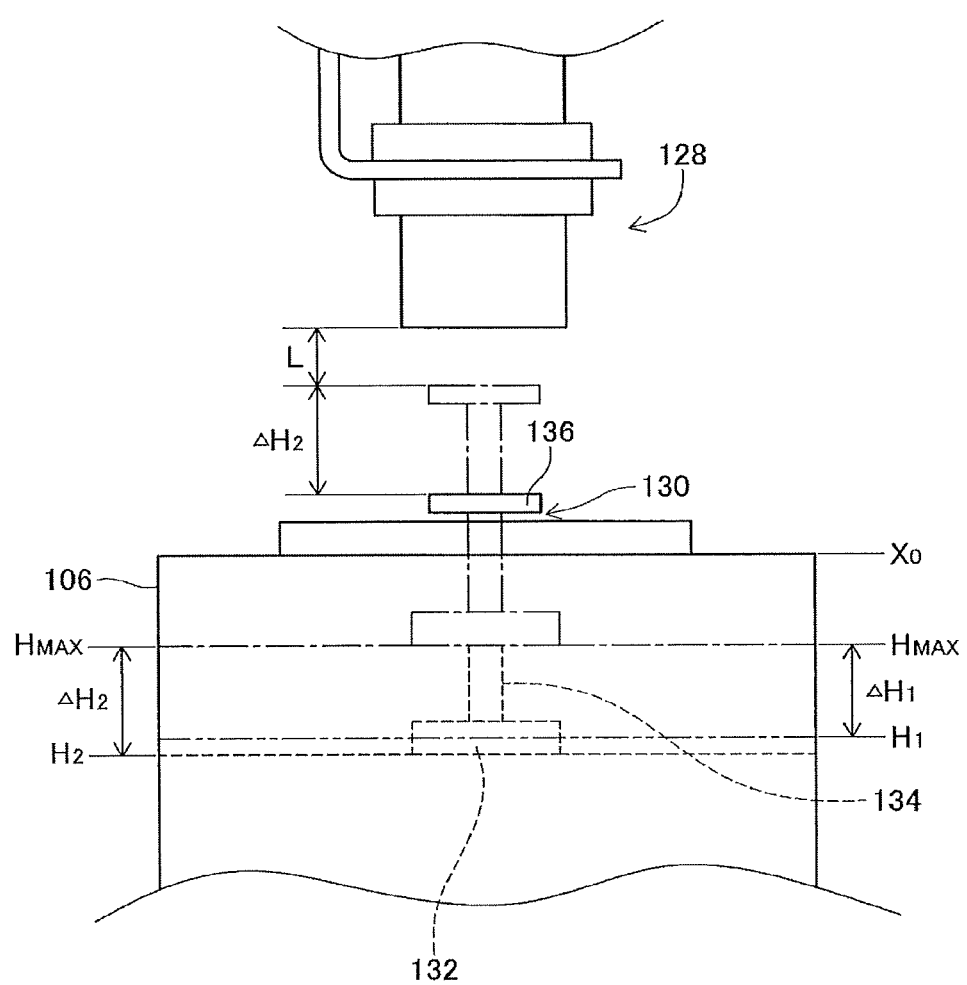
FIG. 9 is a schematic diagram illustrating the solder bath when the first solder remaining amount measurement is performed.
Figure 10:
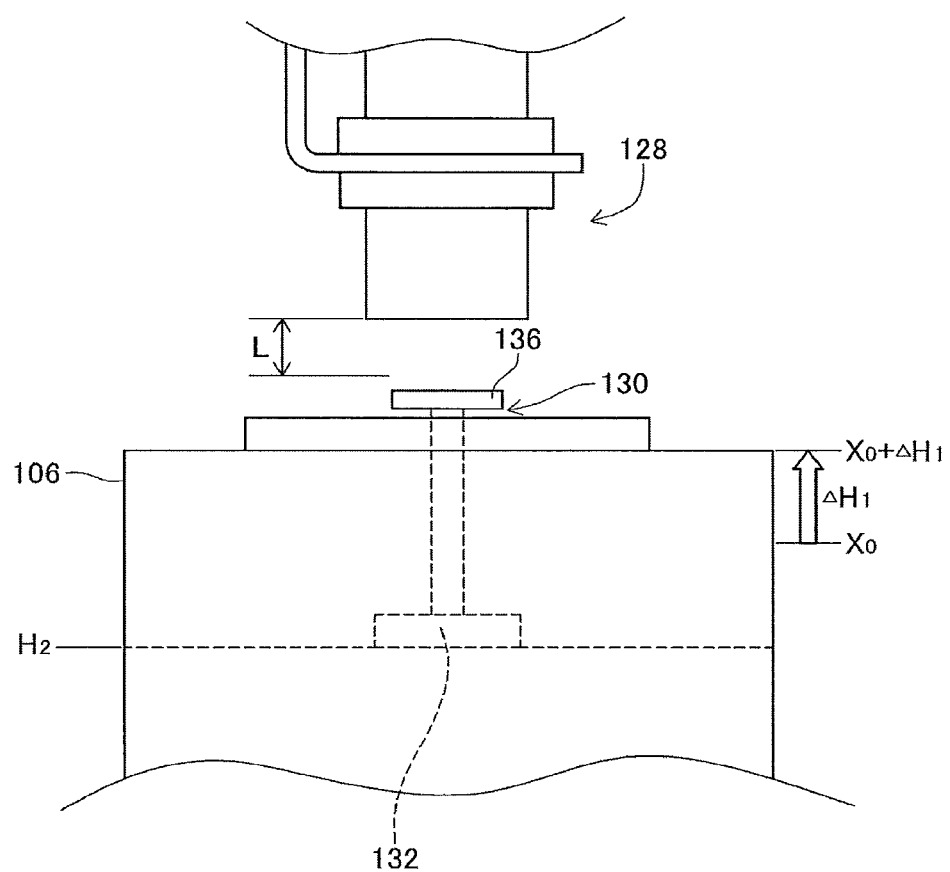
FIG. 10 is a schematic diagram illustrating the solder bath when the first solder remaining amount measurement is performed.

Meanwhile, as illustrated in FIG. 9, in a case where the actual liquid level height $H_2$ is lower than the set height $H_1$, the liquid level difference $\Delta H_2$ is larger than the liquid level difference $\Delta H_1$. In addition, in a case where the molten solder is stored up to the actual liquid level height $H_2$, the difference between the measurement section 136 of the float 130 and the detection sensor 128 corresponds to a value ($\Delta H_2$+L) obtained by adding the set distance L to the liquid level difference $\Delta H_2$ (=$H_{MAX}$−$H_2$) between the maximum liquid level height $H_{MAX}$ and the actual liquid level height $H_2$. Accordingly, in a case where the jet device 100 positioned at the reference height $X_0$ is lifted by a distance corresponding to the liquid level difference $\Delta H_1$, the difference between the measurement section 136 of the float 130 and the detection sensor 128 becomes a value obtained by subtracting the liquid level difference $\Delta H_1$ (<$\Delta H_2$) from the value ($\Delta H_2$+L) obtained by adding the set distance L to the liquid level difference $\Delta H_2$, and is longer than the set distance L, as illustrated in FIG. 10. Accordingly, the measurement section 136 is not detected by the detection sensor 128, and the ON value is not input to the controller 152 by the detection sensor 128. Thereby, the controller 152 determines that molten solder which can be used for performing the soldering work for the arbitrary number of circuit substrates 12 does not remain in the solder bath 106.

As such, the soldering device 36 performs determination on whether or not molten solder which can be used for performing a soldering work for an arbitrary number of circuit substrates 12 remains in the solder bath 106. Thereby, it is possible to perform the soldering work for the arbitrary number of circuit substrates 12 without replenishment of solder, and thus, convenience is improved.

Figure 11:
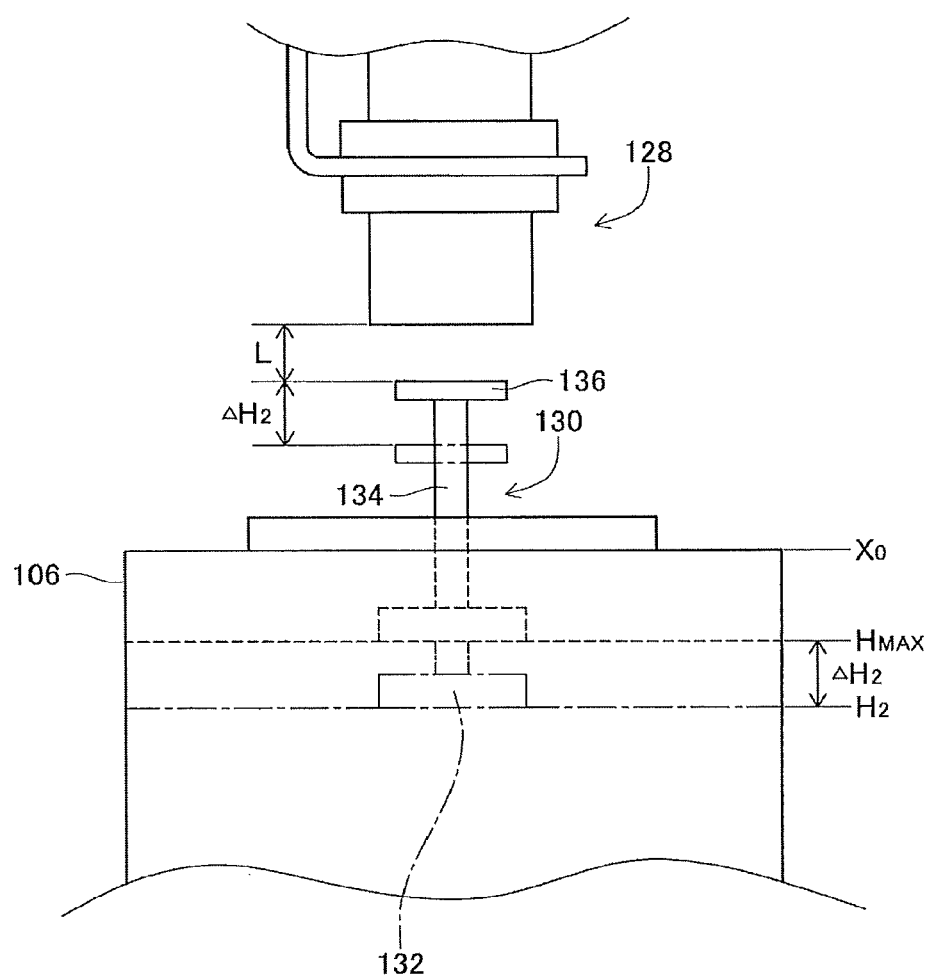
FIG. 11 is a schematic diagram illustrating the solder bath when a second solder remaining amount measurement is performed.
Figure 12:
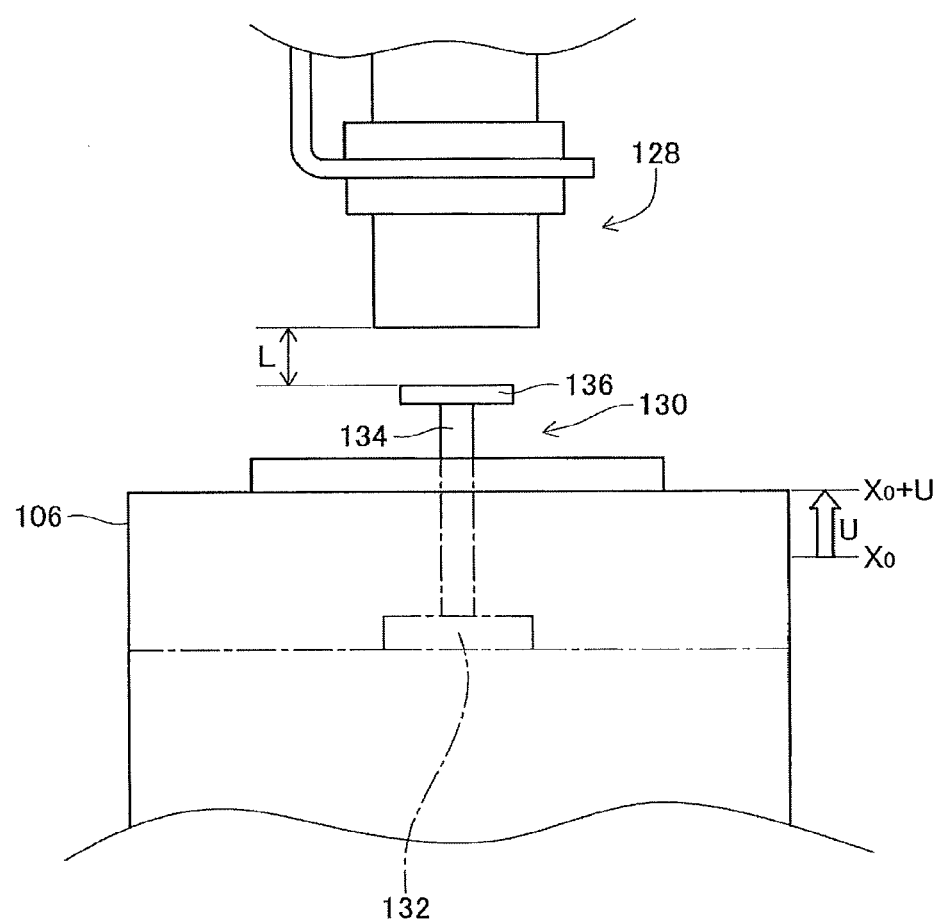
FIG. 12 is a schematic diagram illustrating the solder bath when the second solder remaining amount measurement is performed.

Furthermore, the soldering device 36 performs not only the first solder remaining amount measurement but also measurement (Hereinafter, there is a case of being referred to as a "second solder remaining amount measurement") of the stored amount (hereinafter, there is a case of being referred to as an "actual storage amount") of molten solder actually stored in the solder bath 106. Specifically, as illustrated in FIG. 11, a case where molten solder is stored up to the actual liquid level height $H_2$ will be described. When the second solder remaining amount measurement is performed, the jet device 100 is moved to the reference height $X_0$ by the Z-direction moving device 118. Then, as illustrated in FIG. 12, at a timing at which the jet device 100 is lifted and the measurement section 136 is detected by the detection sensor 128, that is, at a timing at which a distance between the detection sensor 128 and the measurement section 136 reaches the set distance L, a lift amount U from the reference height $X_0$ of the jet device 100 is measured.

Then, if the lift amount U is measured, the actual storage amount is calculated based on the lift amount U. Specifically, as illustrated in FIG. 11, in a case where the float 130 is lifted by a distance corresponding to the liquid level difference $\Delta H_2$ ($=H_{MAX}-H_2$) between the maximum liquid level height $H_{MAX}$ and the actual liquid level height $H_2$, the distance between the detection sensor 128 and the measurement section 136 becomes the set distance L. From this, the liquid level difference $\Delta H_2$ is considered to be the same value as the lift amount U. Accordingly, a difference between a set maximum storage amount $V_{MAX}$ and an actual storage amount $V_R$ is calculated by multiplying the lift amount U by an area S inside the solder bath 106 in the horizontal direction. The set maximum storage amount $V_{MAX}$ is the amount of molten solder stored in the solder bath 106 when molten solder is stored up to the maximum liquid level height $H_{MAX}$. Thereby, the following equation is obtained.

$$V_{MAX}-V_R=U \cdot S$$

Then, the actual storage amount $V_R$ is calculated according to the following equation.

$$V_R=V_{MAX}-U \cdot S$$

As such, if the actual storage amount $V_R$ is calculated, the number (hereinafter, there is a case of being referred to as a "workable number") K of circuit substrates 12 whose soldering work can be performed by the molten solder remaining in the solder bath 106 is calculated based on the actual storage amount $V_R$. Specifically, among the actual storage amount $V_R$ stored in the solder bath 106, the amount of molten solder (hereinafter, there is a case of being referred to as "usable solder amount") $V_U$ that can be actually used for the soldering work is calculated according to the following equation.

$$V_U=V_R-V_{min}$$

$V_{min}$ is the minimum amount of molten solder required for the solder bath 106 in order to properly perform the soldering work. This is because the solder cannot be properly jetted in a case where the amount of molten solder stored in the solder bath 106 is less than or equal to $V_{min}$.

Then, the workable number K is calculated according to the following equation.

$$K \leq V_U/V_0$$

$V_0$ is the amount of molten solder necessary for performing the soldering work for one circuit substrate 12. Thereby, the workable number K is calculated, and a maximum integer of the calculation value becomes the maximum number of circuit substrates 12 whose soldering work can be performed by the molten solder remaining in the solder bath 106. As such, the soldering device 36 can perform the soldering work of the circuit substrates 12 as many as possible without replenishment of the molten solder, by calculating the workable number K.

<Flowchart>

Figure 13:
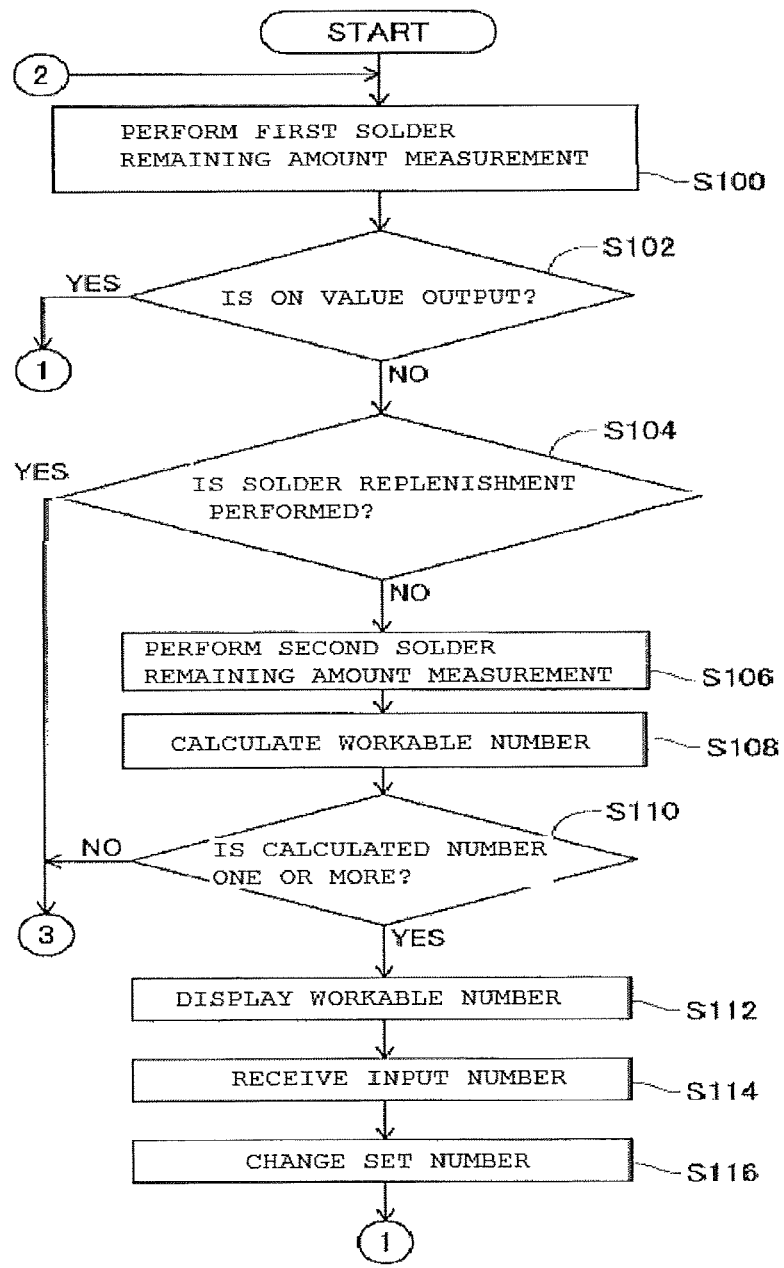
FIG. 13 is a diagram illustrating a flowchart for performing the first solder remaining amount measurement and the second solder remaining amount measurement.
Figure 14:
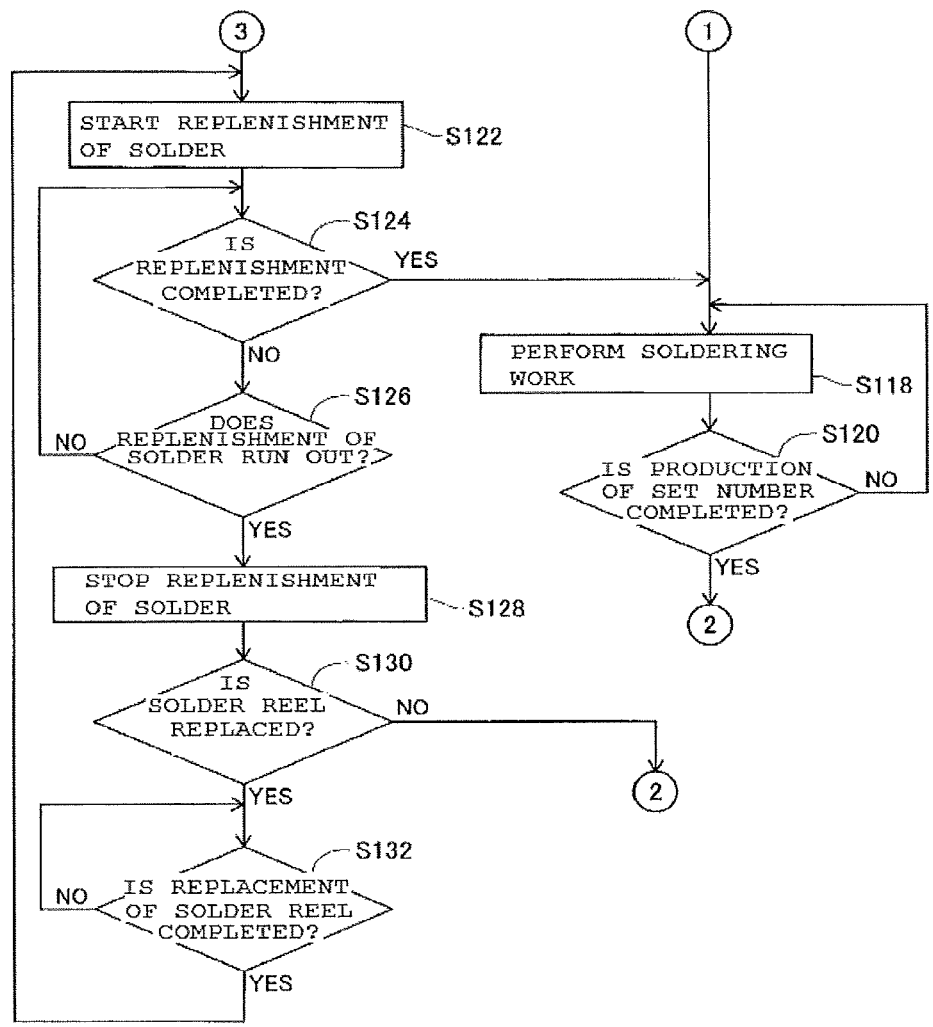
FIG. 14 is a diagram illustrating the flowchart for performing the first solder remaining amount measurement and the second solder remaining amount measurement.

In a case where the first solder remaining amount measurement and the second solder remaining amount measurement are performed, flowcharts illustrated in FIG. 13 and FIG. 14 are executed by the controller 152. Hereinafter, the flowcharts will be described in detail.

In the flowcharts illustrated in the figures, the first solder remaining amount measurement is first performed (S100). Next, in the first solder remaining amount measurement, it is determined whether or not an ON value is output by the detection sensor 128, that is, whether or not a distance between the detection sensor 128 and the measurement section 136 is less than or equal to the set distance L (S102). Then, in a case where the ON value is not output by the detection sensor 128 (NO in S102), that is, in a case where the distance between the detection sensor 128 and the measurement section 136 exceeds the set distance L, performing of solder replenishment is asked (S104).

In detail, since the molten solder for performing the soldering work of the set number of circuit substrates 12 is not stored in the solder bath 106, a screen asking whether or not to replenish solder is displayed on the display device 34. Then, in a case where an operator inputs an indication of performing replenishment of solder in accordance with the screen display, it is determined that the replenishment of solder is performed in S104. Meanwhile, in a case where the operator inputs an indication of not performing the replenishment of solder in accordance with the screen display, it is determined that the replenishment of solder is not performed in S104.

In a case where it is determined that the replenishment of solder is not performed (NO in S104), the second solder remaining amount measurement is performed (S106). Next, the workable number K is calculated based on the actual storage amount $V_R$ measured by the second solder remaining amount measurement (S108). Then, it is determined whether or not the calculated workable number K is one or more (S110). In a case where the workable number K is one or more (YES in S110), the calculated workable number K is displayed on the display device 34 (S112).

Subsequently, the controller 152 receives the input number (S114). In detail, the operator confirms the workable number K displayed on the display device 34, and inputs the number of circuit substrates 12 to be actually executed to the controller 152. Thereby, the controller 152 receives the input number. Then, the controller 152 changes the set number into the received input number (S116). The change of the set number is performed only in a case where reception of the input number is performed, and after the soldering work of the changed set number of circuit substrates 12 is completed, the set number is set to a default value.

Next, the jet device 100 moves to a work area, and a soldering work is performed (S118). Then, it is determined whether or not the soldering work for the set number of circuit substrates 12 is completed (S120). At this time, in a case where the soldering work for the set number of circuit substrates 12 is not completed (NO in S120), processing returns to S118. Meanwhile, in a case where the soldering work for the set number of circuit substrates 12 is completed (YES in S120), the processing returns to S100.

In addition, in a case where it is determined that the replenishment of solder is performed in S104 (YES in S104), replenishment work of solder is started by the solder replenishment device 104 (S122). Next, it is determined whether or not the replenishment of solder is completed, that is, whether or not an ON value is output by the detection sensor 128 at the time of the replenishment of solder (S124). At this time, in a case where the replenishment of solder is completed (YES in S124), the processing after S118, that is, the soldering work is performed.

Meanwhile, if the replenishment of solder is not completed (NO in S124), it is determined whether or not the replenishment of solder is cut, that is, whether or not a solder reel held in a solder reel holding section runs out (S126). Then, in a case where the replenishment of solder does not run out (NO in S126), the processing returns to S124. Meanwhile, in a case where the replenishment of solder runs out (YES in S126), the replenishment of solder performed by the solder replenishment device 104 is stopped (S128). Subsequently, whether or not an exchange work of the solder reel is performed is asked (S130).

In detail, since the replenishment of solder runs out, a screen asking whether or not to perform exchange work of the solder reel is displayed on the display device 34. Then, in a case where the operator inputs an indication of performing the exchange work of the solder reel in accordance with the screen display, it is determined that the exchange work of the solder reel is performed in S130. Meanwhile, in a case where the operator inputs an indication of not performing the exchange work of the solder reel in accordance with the screen display, it is determined that the exchange work of the solder reel is not performed in S130.

In a case where it is determined that the exchange work of the solder reel is not performed (NO in S130), the processing returns to S100. Thereby, it is determined whether or not the soldering work of the set number of circuit substrates 12 can be performed by the molten solder which is in the middle of replenishment. Meanwhile, in a case where it is determined that the exchange work of the solder reel is performed (YES in S130), it is determined whether or not the exchange work of the solder reel is completed (S132). Then, in a case where the exchange work of the solder reel is not completed (NO in S132), the processing of S132 is repeated. Meanwhile, in a case where the exchange work of the solder reel is completed (YES in S132), the processing returns to S122 and the replenishment work of the solder restarts.

In addition, in a case where the workable number K is less than 1 in S110 (NO in S110), the actual storage amount $V_R$ decreases and the soldering work for one circuit substrate 12 cannot be performed, and thereby, the processing proceeds to S122, and the replenishment work of the solder is performed by the solder replenishment device 104.

In addition, in a case where the ON value is output by the detection sensor 128 in S102 (YES in S102), that is, in a case where the distance between the detection sensor 128 and the measurement section 136 is less than or equal to the set distance L in S102, the molten solder for performing the soldering work of the set number of circuit substrates 12 is stored in the solder bath 106, and thereby, the processing proceeds to S118 and the soldering work is performed. By the above processing, the first solder remaining amount measurement and the second solder remaining amount measurement are performed, and the soldering work according to the measurement is performed.

As illustrated in FIG. 5, the controller 152 that executes the above-described flowcharts includes a first estimation section 160 and a second estimation section 162. The first estimation section 160 has a function for performing the processing of S100, that is, the first solder remaining amount measurement. In addition, the second estimation section 162 has a function for performing the processing of S106, that is, the second solder remaining amount measurement. Furthermore, the second estimation section 162 includes a calculating section 164. The calculating section 164 has a function for calculating the processing of S108, that is, the workable number K.

In addition, the circuit substrate 12 is an example of a board. The soldering device 36 is an example of a soldering device. The control device 38 is an example of an estimation device. The solder bath 106 is an example of a solder bath. The Z-direction moving device 118 is an example of a lifting and lowering device. The detection sensor 128 is an example of a detection sensor. The float 130 is an example of a float. The lead component 140 is an example of a lead component. The lead 144 is an example of a lead. The first estimation section 160 is an example of a first estimation section. The second estimation section 162 is an example of a second estimation section. The calculating section 164 is an example of a calculating section. The set height $H_1$ is an example of a first set height. The maximum liquid level height $H_{MAX}$ is an example of a second set height and a maximum liquid level height. The reference height $X_0$ is an example of a first device height.

The present disclosure is not limited to the above-described embodiments, and can be executed in various aspects in which various modifications and improvements are made based on knowledge of those skilled in the art. Specifically, for example, in the above embodiment, the liquid level height of the molten solder inside the solder bath 106 is measured by detecting the distance between the float 130 and the detection sensor 128, but it is possible to adopt a sensor which can directly detect the liquid level height of the molten solder. In addition, the detection sensor 128 is an ON-OFF sensor, but it is possible to adopt a sensor which can detect the distance between the float 130 and the detection sensor 128 as a specific numerical value.

REFERENCE SIGNS LIST

12: circuit substrate (board), 36: soldering device, 38: control device (estimation device), 106: solder bath, 118: Z-direction moving device (lifting and lowering device), 128: detection sensor, 130: float, 140: lead component, 144: lead, 160: first estimation section, 162: second estimation section, 164: calculating section

The invention claimed is:
1. An estimation device estimating an amount of molten solder inside a solder bath of a soldering device soldering leads of a lead component which is mounted on a board by jetting the molten solder stored in the solder bath, the soldering device including a detection sensor configured to detect a liquid level height of the molten solder inside the solder bath, the estimation device comprising:
a first estimation section programmed to:
determine whether or not a detection height that is the liquid level height of molten solder which is detected by the detection sensor is greater than or equal to a first set height which is arbitrarily set, and
in a case where the detection height is greater than or equal to the first set height, estimate that molten solder of an amount capable of performing a soldering work for a predetermined number or more of boards by using the soldering device is stored in the solder bath; and
a second estimation section programmed to estimate the amount of molten solder that is stored in the solder bath by multiplying a difference between the detection height and a preset second set height by an area of the solder bath in a horizontal direction.

2. The estimation device according to claim 1, wherein the estimation device includes at least the first estimation section, and
the first set height is a height corresponding to a capacity which is obtained by multiplying an amount of molten solder necessary for performing a soldering work for one board by using the soldering device by the predetermined number.

3. An apparatus comprising:
the estimation device according to claim 1; and
the soldering device, wherein
the soldering device includes:
a float that floats on the molten solder which is stored in the solder bath; and
a lifting and lowering device that lifts and lowers the soldering device,
the detection sensor is a sensor configured to detect an ON value in a case where a distance between the float and the detection sensor is less than or equal to a set distance,
the estimation device includes at least the first estimation section,
when a preset maximum amount of molten solder is stored in the solder bath, the ON value is detected by the detection sensor, and
in a case where
a lifting and lowering height of the soldering device by the lifting and lowering device in a state where a distance between the float and the detection sensor becomes a set distance is defined as a first device height, and
a liquid level height of molten solder in a case where the preset maximum amount of molten solder is stored in the solder bath is defined as a maximum liquid level height:

the first estimation section determines that the detection height is greater than or equal to the first set height when the ON value is detected by the detection sensor after the soldering device is lifted from the first device height by a distance corresponding to a difference between the maximum liquid level height and the first set height by using the lifting and lowering device.

4. The estimation device according to claim 1, wherein the estimation device includes at least the second estimation section, and
the second estimation section includes a calculating section programmed to calculate a number of boards capable of being soldered by the molten solder which is stored in the solder bath by dividing the amount of molten solder which is estimated to be stored in the solder bath by an amount of molten solder necessary for performing a soldering work for one board by using the soldering device.

5. An apparatus comprising:
the estimation device according to claim 1; and
the soldering device, wherein
the soldering device includes:
a float that floats on the molten solder which is stored in the solder bath; and
a lifting and lowering device that lifts and lowers the soldering device,
the detection sensor is a sensor configured to detect an ON value in a case where a distance between the float and the detection sensor is less than or equal to a set distance,
the estimation device includes at least the second estimation section,
the second set height is a liquid level height of molten solder in a case where a maximum amount of molten solder which is preset is stored in the solder bath,
when the maximum amount of molten solder which is preset is stored in the solder bath, the ON value is detected by the detection sensor, and
in a case where the lifting and lowering height of the soldering device by the lifting and lowering device is defined as a first device height in a state where the distance between the float and the detection sensor becomes the set distance;
the second estimation device estimates the amount of molten solder which is stored in the solder bath by using a lifted amount that is obtained by lifting the soldering device from the first height until the ON value is detected by the detection sensor as a difference between the detection height and the second set height.

* * * * *